United States Patent
Fee et al.

(10) Patent No.: US 9,104,581 B2
(45) Date of Patent: Aug. 11, 2015

(54) EDRAM REFRESH IN A HIGH PERFORMANCE CACHE ARCHITECTURE

(75) Inventors: Michael Fee, Cold Spring, NY (US); Arthur J. O'Neill, Jr., Poughkeepsie, NY (US); Robert J. Sonnelitter, III, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 775 days.

(21) Appl. No.: 12/822,245

(22) Filed: Jun. 24, 2010

(65) Prior Publication Data

US 2011/0320696 A1    Dec. 29, 2011

(51) Int. Cl.
   G06F 13/14    (2006.01)
   G06F 12/02    (2006.01)
   G06F 12/08    (2006.01)
   G06F 13/16    (2006.01)
   G11C 11/406   (2006.01)

(52) U.S. Cl.
   CPC ............ G06F 12/0893 (2013.01); G06F 13/14 (2013.01); G06F 13/16 (2013.01); G06F 13/1605 (2013.01); G06F 13/1636 (2013.01); G11C 11/406 (2013.01); G11C 11/40603 (2013.01); G11C 11/40618 (2013.01); G11C 2207/104 (2013.01)

(58) Field of Classification Search
   CPC ........... G11C 11/406; G11C 11/40603; G11C 11/40618; G11C 2207/104; G06F 13/14; G06F 13/16; G06F 13/1605; G06F 13/1636; G06F 12/0893
   USPC ......... 711/5, 105, 106, 118, 154; 365/185.25, 365/222
   See application file for complete search history.

(56) References Cited

U.S. PATENT DOCUMENTS

| | | | |
|---|---|---|---|
| 4,536,839 A * | 8/1985 | Shah et al. ............... | 711/151 |
| 5,446,696 A   | 8/1995 | Ware et al. | |
| 5,615,343 A * | 3/1997 | Sarangdhar et al. ....... | 710/112 |
| 5,706,482 A * | 1/1998 | Matsushima et al. ..... | 345/535 |
| 6,222,785 B1 * | 4/2001 | Leung ...................... | 365/222 |
| 6,285,616 B1 | 9/2001 | Ikabata | |
| 6,298,413 B1 * | 10/2001 | Christenson .............. | 711/106 |

(Continued)

OTHER PUBLICATIONS

Bezerra et al., "A short study of the addition of an L4 cache memory with interleaved cache hierarchy to multicore architectures", Aug. 2009, VII Workshop de Processamento Paralelo e Distribuído, Porto Alegre, RS, Brazil. Retrieved on Jun. 13, 2014 from <http://www.inf.ufrgs.br/~cebbezerra/publications.php>.*

*Primary Examiner* — Arpan P. Savla
(74) *Attorney, Agent, or Firm* — Cantor Colburn LLP; Margaret McNamara

(57) ABSTRACT

A memory refresh requestor, a memory request interpreter, a cache memory, and a cache controller on a single chip. The cache controller configured to receive a memory access request, the memory access request for a memory address range in the cache memory, detect that the cache memory located at the memory address range is available, and send the memory access request to the memory request interpreter when the memory address range is available. The memory request interpreter configured to receive the memory access request from the cache controller, determine if the memory access request is a request to refresh a contents of the memory address range, and refresh data in the memory address range when the memory access request is a request to refresh memory.

11 Claims, 6 Drawing Sheets

(56) References Cited

U.S. PATENT DOCUMENTS

| | | | |
|---|---|---|---|
| 6,310,814 B1* | 10/2001 | Hampel et al. | 365/222 |
| 6,459,650 B1* | 10/2002 | Lin | 365/233.1 |
| 6,463,001 B1* | 10/2002 | Williams | 365/222 |
| 6,600,677 B2* | 7/2003 | Afghahi et al. | 365/187 |
| 6,941,415 B1* | 9/2005 | Ryan | 711/106 |
| 6,967,885 B2 | 11/2005 | Barth, Jr. | |
| 8,244,972 B2 | 8/2012 | Bronson et al. | |
| 2003/0189859 A1 | 10/2003 | Takahashi et al. | |
| 2006/0004955 A1* | 1/2006 | Ware et al. | 711/106 |
| 2008/0151670 A1 | 6/2008 | Kawakubo et al. | |
| 2009/0006718 A1* | 1/2009 | Blumrich et al. | 711/103 |
| 2009/0150621 A1 | 6/2009 | Lee | |
| 2009/0172225 A1* | 7/2009 | Wiedenman et al. | 710/107 |
| 2009/0248972 A1 | 10/2009 | Ware | |
| 2010/0027363 A1* | 2/2010 | Li et al. | 365/222 |
| 2011/0252202 A1* | 10/2011 | Heine et al. | 711/141 |

* cited by examiner

EDRAM REFRESH IN A HIGH PERFORMANCE CACHE ARCHITECTURE

BACKGROUND

This invention relates generally to processing within a computing environment, and more particularly to refreshing eDRAM in a high performance cache architecture.

Every new generation of high performance computers seeks increases in performance. There are several methods employed to increase performance, one such method is to increase the size of the computer processor memory caches. Computer processor memory caches are used to improve the access speed of data by storing more frequently used data in fast memory located as close as possible to the computer processor. These computer processor memory caches may include Static Random Access Memory (SRAM) circuits for example. Higher performance computer systems, however, use Embedded Dynamic Random Access Memory (eDRAM) cache circuits. The eDRAM cache allows for greater capacity in a smaller physical space by including a higher density of memory circuits within the same area. The eDRAM cache provides higher performance as compared to SRAM cache because of the higher density of data stored closer to the computer processor. eDRAM cache, however, requires periodic refreshing of the contents of memory. These periodic refreshes may result in degraded performance.

BRIEF SUMMARY

Additional embodiments include an apparatus for implementing eDRAM refreshes in a high performance cache architecture. The apparatus comprising a cache comprising a memory refresh requestor, a memory request interpreter, a cache memory, and a cache controller on a single chip. The apparatus further comprises the cache controller configured to receive a memory access request, the memory access request for a memory address range in the cache memory, detect that the cache memory located at the memory address range is available, and send the memory access request to the memory request interpreter when the memory address range is available. The apparatus further comprises the memory request interpreter configured to receive the memory access request from the cache controller, determine if the memory access request is a request to refresh a contents of the memory address range, and refresh data in the memory address range when the memory access request is a request to refresh memory.

Further embodiments include an apparatus for implementing eDRAM refreshes in a high performance cache architecture. The apparatus comprising a cache comprising a cache memory, and a cache controller. The apparatus further comprising the cache controller configured to receive a memory access request, the memory access request for a memory address range in the cache memory, detect that the cache memory located at the memory address range is available, and send the memory access request to a memory request interpreter when the memory address range is available. The apparatus further comprising the memory request interpreter configured to receive the memory access request from the cache controller, determine if the memory access request is a request to refresh a contents of the memory address range, and refresh data in the memory address range when the memory access request is a request to refresh memory.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

High performance computer systems depend on processing data at high speeds. Typical computer systems store data hierarchal in various forms and locations of memory. Most data is stored in main memory. Main memory is large, however, because main memory is accessed over a memory bus, access to data can be slow and resource contentions caused by bottlenecks are common. Modern computer systems store frequently accessed data in cache memory. The cache memory is located on or near the computer processor chip. The cache is arranged in levels. Level one (L1) cache is closest to the processing core, and level two (L2), level three (L3), level four (L4) and other memory levels progressively more distant. Because caches are often much smaller than main memory space is limited and the most accessed data is placed closest to the core. The larger the cache, the more data can be stored, and therefore quickly accessed by the processing core. Typical cache memory, such as SRAM, uses large cache memory structures, which take up more physical space, and are slower to access than smaller caches. eDRAM, however, can fit more memory capacity in the same physical area than SRAM. Therefore, the use of eDRAM can greatly increase the capacity and speed of data access. eDRAM is based on capacitors as opposed to transistor based memory such as SRAM, and therefore, over time, the data that is stored in eDRAM as electrical signals starts to degrade. eDRAM must be refreshed periodically by recharging the capacitors. This is typically done in main memory using dedicated circuitry. When eDRAM is implemented in cache, however, these additional dedicated circuits may interfere with the performance of the cache. Therefore, where eDRAM is used in cache, it would be preferable to send requests to refresh data over the same cache pipelines as are used for cache data access requests.

Figure 1:
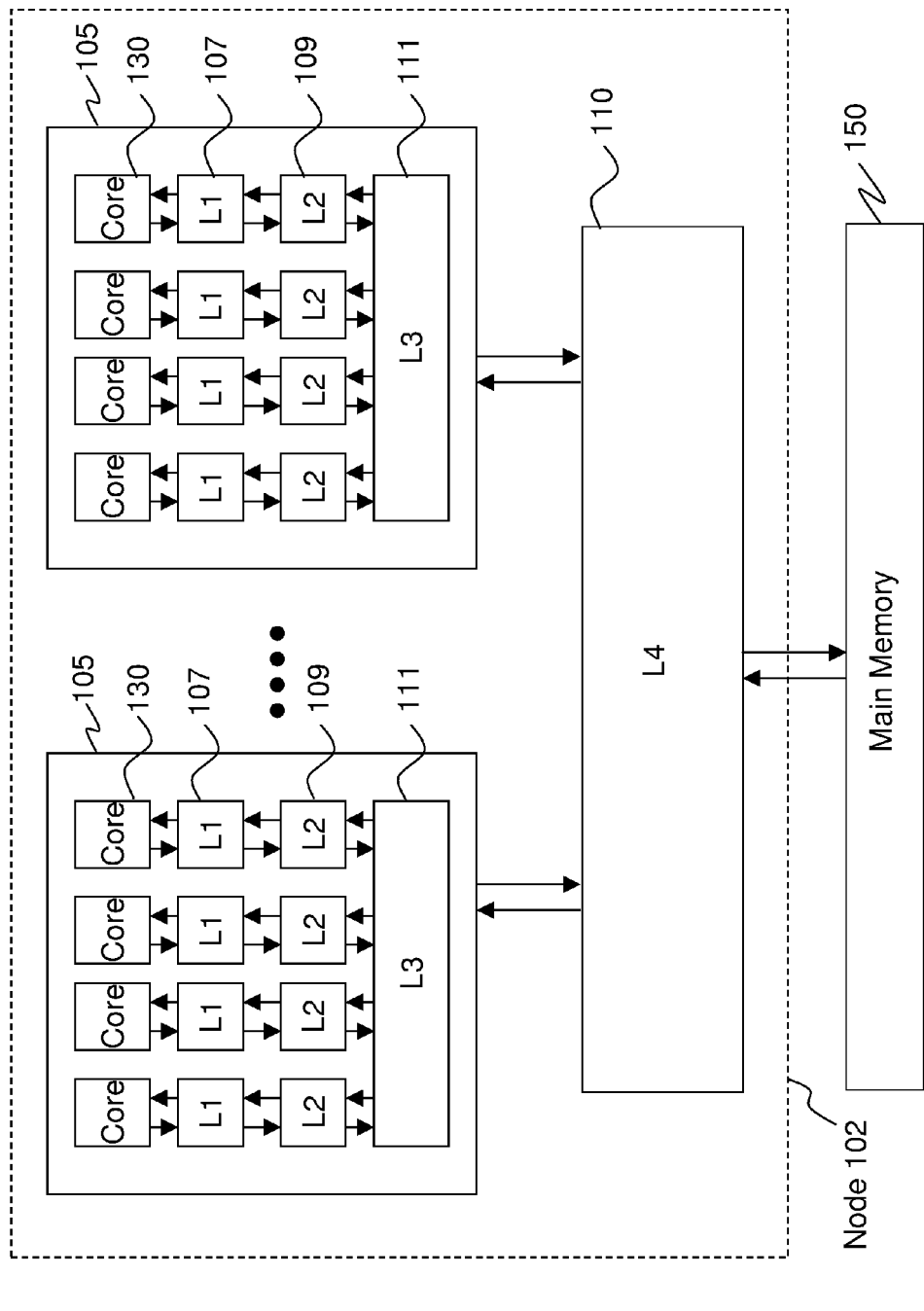
FIG. 1 depicts an example of a system on which embodiments of the present invention may be implemented.

FIG. 1 illustrates an example of a computing system 100 according to one embodiment. The system includes one or more nodes 102. In one embodiment, the computing system 100 may include four nodes 102. In the computing system 100, multiple nodes 102 may be operatively connected to one another for communicating such as making and responding to requests, as is understood by one skilled in the art.

Each node 102 includes one or more central processors 105. In one embodiment, each node 102 includes six central processors 105. The central processors 105 include one or more cores 130 that perform the reading and executing of instructions. In one embodiment, one or more of the central processors 105 include four cores 130. Of course, the central processors 105 could include any number of cores 130 that is greater than or equal to two.

Each core 130 is operatively coupled to its own L1 and L2 cache, 107 and 109 respectively. The L1 caches 107 are physically closest to the cores 130 and the L2 caches 109 are coupled to the L1 caches 107. Each L2 cache 109 in each central processor 105 is coupled to a single L3 cache 111. In this manner, the L3 cache 111 is shared by multiple L2 caches 107 and accessible by each of the cores 130.

The node 102 also includes one or more L4 caches 110. The L4 caches 110 are operatively coupled to two or more central processors 105. In this manner, the L4 caches 110 are shared by multiple L3 caches 111 and accessible by any of the cores 130 on any of the central processors 105. The computing system 100 may also include main memory 150 operatively coupled to the L4 caches 110.

In one embodiment, the L3 caches 111 and L4 cache 110 are formed of embedded dynamic random access memory (DRAM) which is referred to as eDRAM. Of course, it is understood by a skilled artisan that any other types of suitable memory such as DRAM may be utilized. In one embodiment, the L2 caches 109 may be formed of static random access memory (SRAM).

In one embodiment, each individual central processor 105 is fabricated on its own separate chip, which includes the L1, L2, and L3 caches, and the L4 cache 110 is fabricated on its own separate chip. As understood by a skilled artisan, fabrication of chips including integrated circuits, wires, metal layers, semiconductor (and/or other material) components, etc., may be formed via lithography and other techniques. The fabrication process may include various deposition techniques including physical vapor deposition (PVD), chemical vapor deposition (CVD), electrochemical deposition (ECD), molecular beam epitaxy (MBE), and atomic layer deposition (ALD) among others.

In an exemplary embodiment, the L1 caches 107 are between 96 and 128 KB, the L2 caches 109 are 1.5 MB, the L3 cache is 24 MB and the L4 cache 110 is 192 MB. Of course other sizes could be utilized. In FIG. 1, the four different levels of caches (L1, L2, L3 and L4) are shown. Of course, such an organization of caches is exemplary only and the teachings herein may be applied to any situation where multiple central processors 105 have access to a shared cache and the shared cache is one of a plurality of shared caches that have access to another shared cache.

Figure 2:
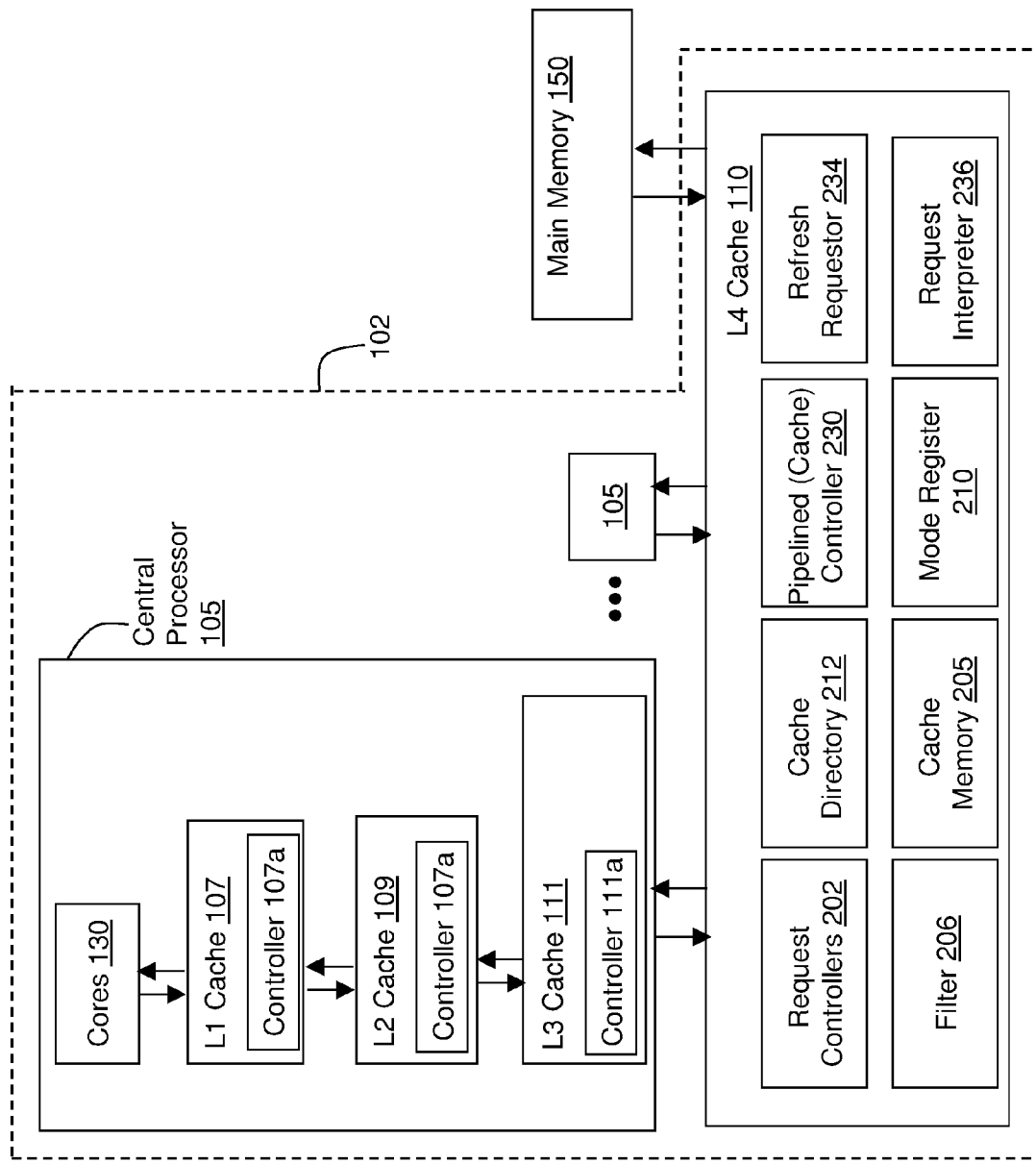
FIG. 2 depicts an embodiment of a system node on which embodiments of the present invention may be implemented.

FIG. 2 illustrates further details of the central processor 105 and the L4 cache 110 according to exemplary embodiments. For ease of explanation, FIG. 2 shows the details of a single central processor 105 operatively connected to a single L4 cache 110 but applies for multiple central processors 105 and multiple L4 caches 110. In FIG. 2, each of the L1 caches 107, L2 caches 109, L3 caches 111, and L4 caches 110 includes its own respective pipelined cache controller 107a, 109a, 111a, and 230 for controlling various operations such as sending, receiving, and executing requests (also referred to as request signals).

In accordance with exemplary embodiments, one or more requestors (also referred to herein as memory access request sources) indicate all of the desired resources and/or actions that they wish to be performed by the L4 cache 110, even if the requestor does not necessarily require that all actions be performed in one pass through the pipelined cache controller 230 of L4 cache 110. In one embodiment the requestors are L3 caches 111, the L2 caches 109, the L1 caches 107, the cores 130, and other nodes 102. In an exemplary embodiment the requestors are on a plurality of central processor 105. In additional embodiments the requestors are on a single central processor 105. The requestors may be on the same and/or different nodes 102. In further embodiments the requestor is an I/O controller (not shown), as understood by one skilled in the art. Each requestor is able to individually transmit requests to one or more request controllers 202 indicating the desired actions and/or resources that the requestors wish for the L4 cache 110 to perform.

The requests may refer to accessing a cache directory 212 of L4, or cache memory 205 of the L4 cache 110 (also referred to herein as memory access requests), or to accessing main memory 150, and/or accessing other nodes 102. The L4 cache 110 of FIG. 2 includes a plurality of components for controlling various operations as described above. The requestors request access to a plurality of these components such as the cache directory 212, cache memory 205 of the L4 cache 110. In addition, the requestors request access to main memory 150, and other nodes 102. Also note that although exemplary implementations depict examples with respect to the L4 cache 110, it is understood that exemplary embodiments are not meant to be limited to operations of the L4 cache 110. For example, the technique disused herein applies equally to the L3 cache 111 receiving requests from, e.g., the L2 cache 109 and the L4 cache 110. Furthermore, the L1 cache 107, L2 cache 109 and the L3 cache 111 may include the elements shown and described for the L4 cache 110. Also, additional embodiments may be implemented in, e.g., main memory 150, external memory (not shown), and any other hardware component, and the main memory 150, external memory, and hardware component would include the elements shown and described herein for the L4 cache 110.

A plurality of requestors (such as cores 130, L3 caches 111, L2 caches 109, L1 caches 107, and/or other nodes 102) make requests to the request controllers 202 of the L4 cache 110. Each request controller 202 receives these requests as an 8-bit vector, via a request signal from the requestors. Each bit of the 8-bit vector corresponds to an action and/or a series of actions for the L4 cache 110 to perform, and the 8-bit vector may be referred as the mode, request mode, pipeline mode, and/or mode (0:x). The 8-bit vectors are stored in (read into) respective mode registers 210 of the L4 cache. Note that although an 8-bit vector may be discussed for explanation purposes, other size vectors (e.g., smaller and larger) may also be utilized and exemplary embodiments are not meant to be limited to any one sized vector.

According to exemplary embodiments, the requestors such as the cores 130 and L3, L2, and L1 caches (via their respective pipelined cache controllers 111a, 109a, and 107a) are each configured to transmit additional signals along with their request signal to the request controllers 202. As a result, in addition to the request controllers 202 receiving the 8-bit vector, which is the mode as described above, the request controllers 202 are configured to receive and process the additional signal via filters 206. The additional signal may be an additional 8-bit vector that allows the filter 206 to determine if the filter 206 can dynamically modify (i.e., whether it has permission to modify) the mode received from the requestor. The additional 8-bit vector is configured to correspond one-to-one to bits of the 8-bit vector of the mode, and when a (flexible) bit of the additional 8-bit vector is turned on, the filter 206 is configured to read this flexible bit as a designation that the corresponding bit of the 8-bit vector of the mode is flexible. The filter 206 includes input selection logic, e.g., such as logic gates, configured to perform logic operations to determine if modification is permitted and/or needed as discussed herein.

Using the additional set of signals in accordance with exemplary embodiments, the requestor is able to indicate (to the filter 206 of the L4 cache 110) which actions and/or resources the requestor can allow to be deferred to a subsequent (and/or multiple subsequent) pipe controller request. The input selection logic of the filter 206 is then able to check the availability of the requested actions and/or resources. If one or more requested actions and/or resources is not available and if the requestor has indicated in the additional signal that all of these unavailable actions and/or resources can be deferred to a subsequent pipeline request, the selection logic of the filter 206 is configured to allow that request from the requestor to enter the pipelined cache controller 230 by altering the mode. To signal that some requested actions and/or resources were unavailable in the mode, the selection logic of the filter 206 dynamically alters the requestor's pipeline mode to indicate which actions were actually performed and which (originally requested) actions are not performed. The request controller 202 compares the altered mode that entered into the pipelined controller with the original mode it requested to determine which actions the request controller 202 must still complete. In other words, any actions that were unable to be performed and removed in the altered mode (by the filter 206), can be determined and attempted again by the request controller 202. The request controller 202 and/or the requestor can send a new request in a mode requesting the particular actions that were not performed earlier.

With this method, requestors indicating a need for multiple actions and/or resources do not need to serialize their requests. Instead, the requestors can request everything that they want to do, and if all the action/resources are available, the actions and/or resources will be performed in one pass through the pipelined cache controller 230. If some actions needing particular resources are unavailable, those actions for resources that are available are allowed to proceed by the filter 206, while the actions for unavailable resources are removed from mode by the filter 206 and thus not performed. On average, requestors will be able to complete their pipelined controller activity with fewer pipeline requests compared to forcing the requestors to serialize their requests.

The pipelined cache controller 230 accesses a cache directory 212 to obtain the location of what memory addresses are available in the cache memory 205. The L4 cache also includes a refresh requestor 234 (also referred to herein as a memory refresh requestor) and a request interpreter 236 (also referred to herein as a memory request interpreter) for interpreting the refresh requests sent by the refresh requestor 234 for refreshing the cache memory 205 as will be described in more detail below. In an exemplary embodiment the request interpreter 236 is logic built into a bank model (not shown) of the cache, which interprets all data access requests sent by requestors as is known in the art.

The L4 cache 110 is detailed for ease of explanation, but it will be understood that in an exemplary embodiment the L3 cache 111 may include the same components described above with regard to the L4 cache 110. In additional embodiments, the L1 cache 107 and L2 caches 109 additionally may include the components described above with regard to the L4 cache 110. Although exemplary embodiments of L4 cache and L3 cache include all of the components above on a single processing circuit (cache chip), in additional embodiments, some or all of the components may exist outside of the cache chip.

Figure 3:
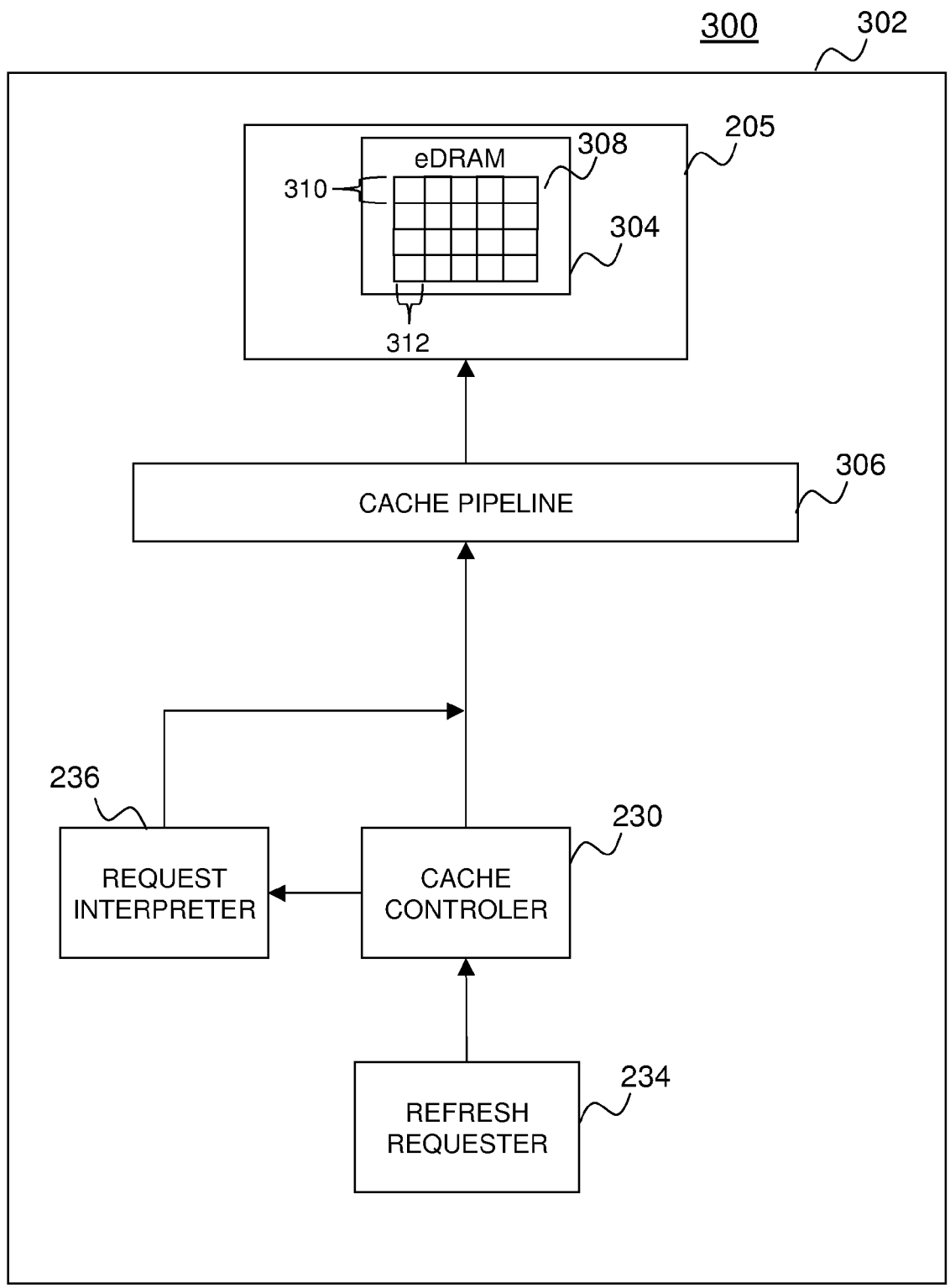
FIG. 3 depicts an example of a cache controller according to one embodiment on which the present invention may be implemented.

Turning now to FIG. 3, an exemplary embodiment of a memory refresh system 300 including the memory refresh components 234 and 236 depicted in FIG. 2 for refreshing cache memory 205 will be described. In an exemplary embodiment, the cache memory 205 includes eDRAM 304. The eDRAM 304 includes addressable memory circuits 308 for storing data. The data is stored and accessed in the eDRAM 304 by an address in the addressable memory circuit 308. The addressable memory circuits 308 are configured in rows 310 and columns 312 collectively called cache blocks. In an exemplary embodiment, the cache blocks are built onto a single chip such as eDRAM 304, however, in alternate embodiments, the cache blocks are built across multiple chips as is known in the art. The eDRAM's 304 addressable memory circuits 308 store data as an electrical signal wherein voltage above a preset voltage (e.g. 0.85 volts) signifies a binary 1 with lower voltages signifying binary zero as is known in the art. In one embodiment 0.85 volts is the cutoff for binary 1 for, of course other voltages (e.g., lower and higher) may also be utilized and exemplary embodiments are not meant to be limited to any one voltage.

The addressable memory circuits 308 include capacitors (not shown) that are charged to indicate binary 1 and discharged to indicate binary 0. After a period of time (e.g. 40 microseconds) the charge applied to the capacitor degrades to a point where the binary 1 will be read as a binary 0. The period of time after which data may be lost is specified in real time and not processing cycles (i.e. CPU cycles). In order to prevent the loss of data that would occur in this situation, each of the addressable memory circuits 308 are refreshed periodically, recharging the capacitors that are set to binary 1. The eDRAM 304 is preferably refreshed before the eDRAM 304 loses data. Refreshes are sent as refresh requests (also referred to herein as memory refresh requests) by the refresh requestor 234. In an exemplary embodiment the refresh requestor 234 sends refresh requests to the cache controller 204 the using the same 8-bit vector described above and a target memory address or address range of the cache row 310 that is to be refreshed. Of course other sized and formatted refresh requests could also be used. The refresh requests are in the same format as memory access requests sent by other requestors and are, therefore, interpreted by the cache controller 204 as standard memory access requests. The cache controller 204 routes the refresh request to the request interpreter 236 (also referred to herein as memory request interpreter). The request interpreter 236 reads the data access request and identifies the data access request as a refresh request as will be described in more detail below. The refresh request is then sent to the pipeline controller 222, which places the refresh request in the cache pipeline 306 when the address targeted in the refresh request is free as will be described in more detail below. The cache pipeline 306 routes the refresh request to the cache memory 205, which causes the target addressable memory circuit 308 to be refreshed by rewriting the contents of the memory.

Figure 4:
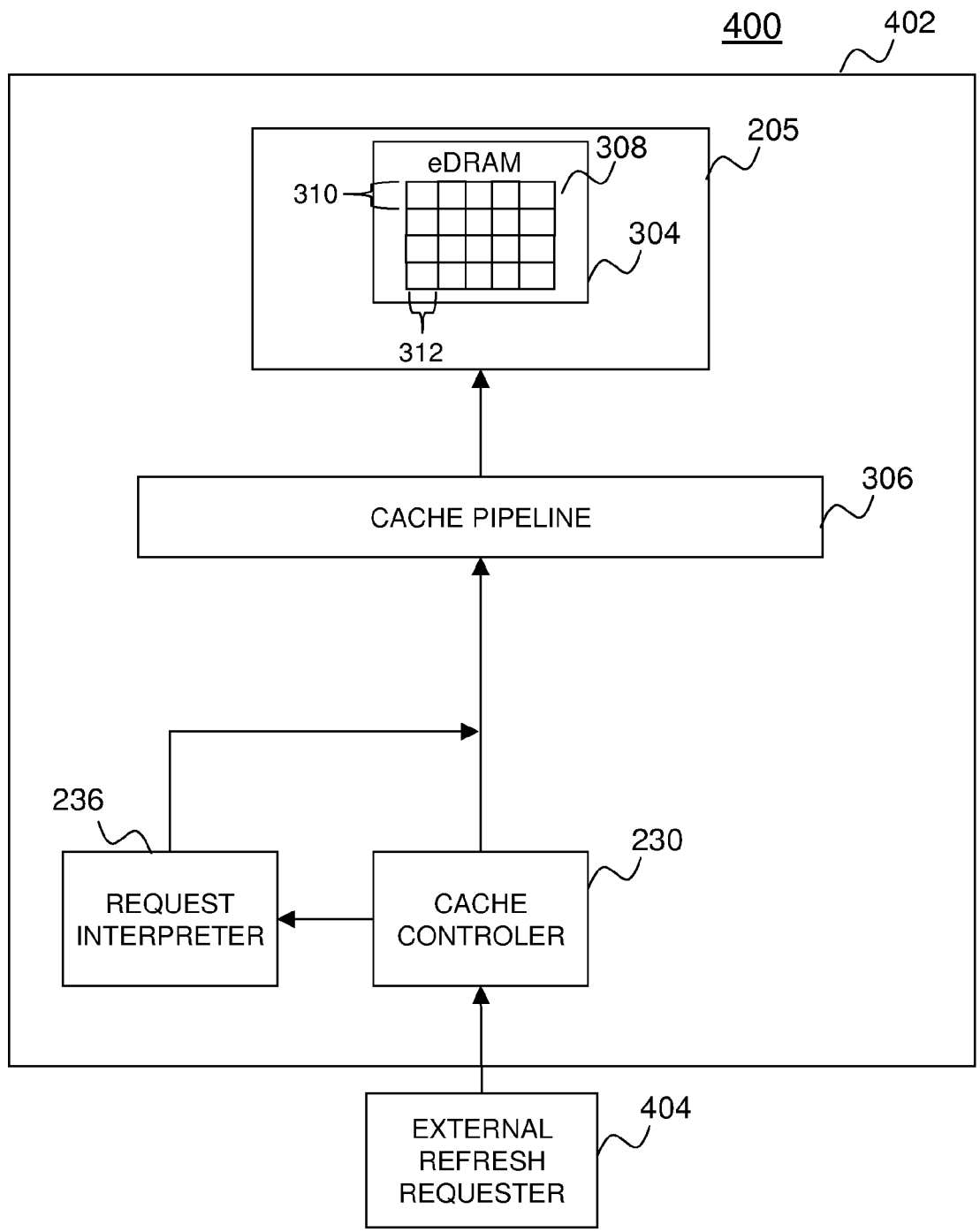
FIG. 4 depicts an alternate embodiment of a cache controller according to on which the present invention may be implemented.

Turning now to FIG. 4, an additional embodiment of an externally supported memory refresh system 400 including memory refresh components 234 and 236 depicted in FIG. 2 for refreshing cache memory 205 will be described. In an exemplary embodiment, the cache memory 205 includes eDRAM 304 as described above with regard to FIG. 3.

Returning again to FIG. 4, the addressable memory circuits 308 require periodic refreshes as described above. The refreshes are provided as refresh requests from an external refresh requestor 404. The external refresh requestor 404 can be located within the central processor 105 or outside of the central processor 105, and within the node 102 and shared among the various central processors 105 in the node 102. The external refresh requestor 404 is operatively coupled to the cache components 402 and sends refresh requests to the cache components 402 at intervals (also referred to herein as refresh intervals) that ensure that none of the addressable memory circuits 308 of the eDRAM 304 experience data loss as a result of degraded power signals. The refresh requests received by the cache components 402 are routed to the cache controller 204 and are processed by the request interpreter 236 as described above. The request interpreter 236 places the refresh request on the cache pipeline 306 when the address targeted in the refresh request is free as will be described in more detail below. The cache pipeline 306 routes the refresh request to the cache memory 205, which causes the target addressable memory circuit 308 to be refreshed.

Figure 5:
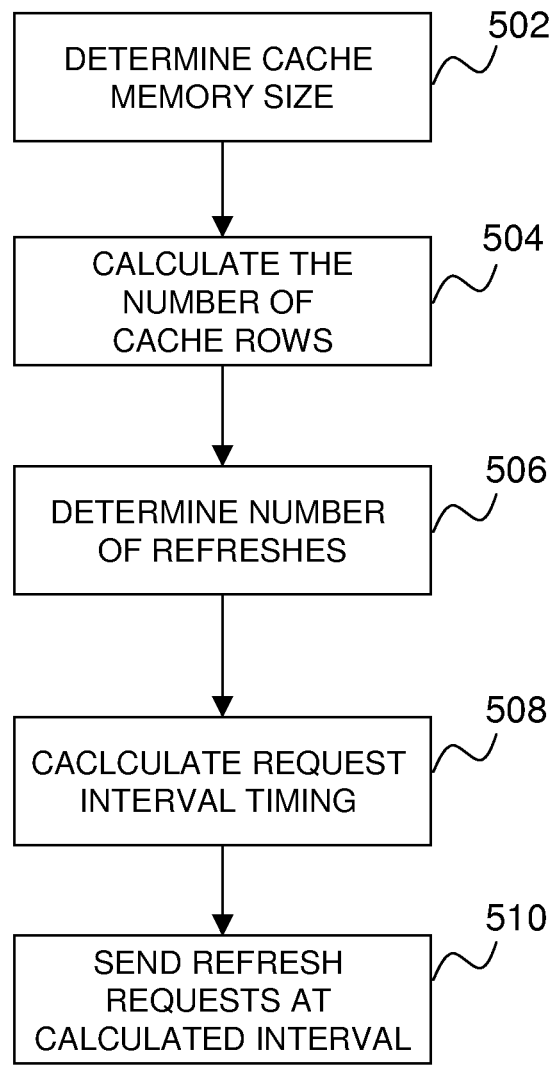
FIG. 5 depicts a block diagram of a process flow for determining the cache refresh frequency according to an exemplary embodiment of the invention.

Turning now to FIG. 5, a detailed block diagram of an exemplary embodiment of a refresh request frequency determination processing flow will now be described. In an exemplary embodiment, the refresh request frequency determination processing flow executes in the refresh requestor 234 of FIGS. 3 and 4. At block 502 the size of the eDRAM 304 of the memory element 205 is determined. This value can be configured prior to system initialization, or can be determined by inspecting available memory of the memory element 205. At block 504, based on the size of the eDRAM 304, the number of cache rows 310 is determined. The number of cache rows 310 may be determined by dividing the total size of the eDRAM 304 by the width of the eDRAM 304 (i.e. the number of columns 312). At block 506 the number of refreshes required to refresh the eDRAM 304 is calculated. In an exemplary embodiment, the eDRAM 304 is refreshed one cache row 310 at a time. Therefore the number of refresh requests required to refresh the eDRAM 304 is equal to the number of rows 310. Although the memory refresh requests have been described as refreshing one row 310 of data at a time, it will be understood that in alternate embodiments the refresh requester may be configured to update any size block of memory including a single bit at a time. In further embodiments, the request requester may be configured to refresh varying sized blocks of memory such that two subsequent requests may refresh two different sized blocks of memory. In yet other embodiments, the refresh request may refresh the entire eDRAM 304 at once.

Returning now to block 508, once the number of refreshes is determined, the interval between refresh requests is calculated. The interval between refresh requests is the maximum number of processing cycles between refresh requests that will allow all of the eDRAM 304 to be refreshed before the eDRAM 304 experiences data loss. The number of cycles between each refresh will vary based on the clock frequency of the central processor 105 and the number of rows 310 in the eDRAM 304. The eDRAM 304 is discharged at a rate based on real time (also described herein as the refresh window) and not processing cycles. In order to determine the correct number of processing cycles between each refresh request the number of processing cycles that occur in the refresh window must be determined. In an exemplary embodiment the number of cycles between each refresh request is calculated as (total number of cycles in the refresh window—the number of rows 310)/the number of rows 310. In alternate embodiments the number of cycles between refresh requests may be any number of cycles, including fewer cycles than calculated above, that would allow the eDRAM 304 to be completely refreshed within the refresh window. One way of optimally adjusting the frequency of refresh requests is described in commonly assigned U.S. patent application Ser. No. 12/822,830, entitled "OPTIMIZING EDRAM REFRESH RATES IN A HIGH PERFORMANCE CACHE ARCHITECTURE" filed on Jun. 24, 2010, which is incorporated by reference herein in its entirety.

Figure 6:
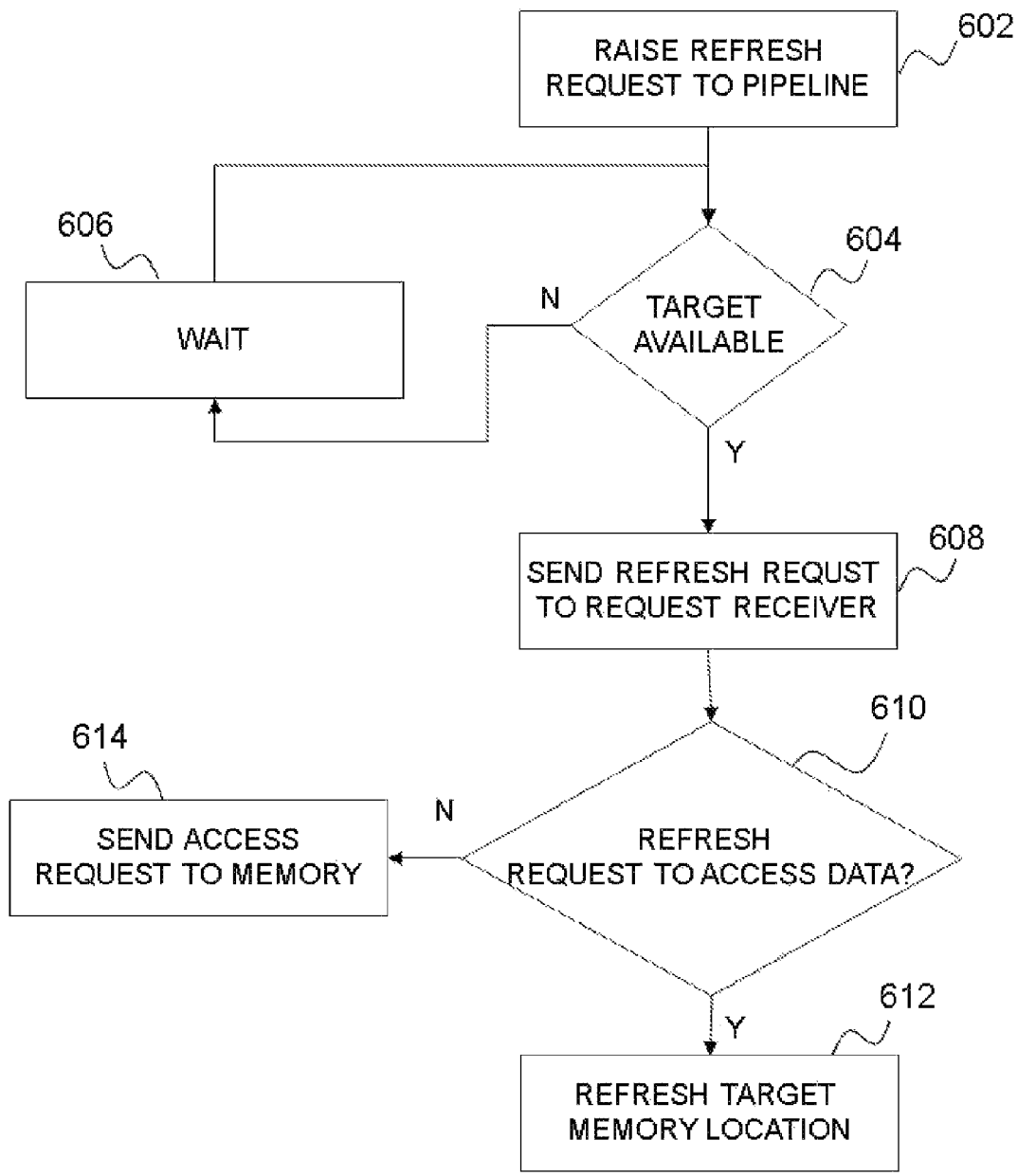
FIG. 6 depicts a block diagram of a process flow for refreshing the cache according to an exemplary embodiment of the invention.

Turning now to FIG. 6 a detailed block diagram of an exemplary embodiment of a refresh request processing flow will now be described. In an exemplary embodiment, the refresh request processing flow executes in the memory refresh system 300 of FIG. 3 or the externally supported memory refresh system 400 of FIG. 4. At block 602 the refresh requestor 234 or external refresh requestor 404 send a refresh request to the cache controller 204. In an exemplary embodiment, the refresh request contains a single bit to indicate that the request is for a refresh and not a data access request, and the address range that is to be refreshed is at the cache pipeline 306 and incremented after each refresh request is sent. In alternate embodiments, the refresh request contains a single bit identifier (ID) and an address range that is to be refreshed. The refresh request appears to the cache controller 204 as a typical memory access request and is treated the same as any other memory access request. In exemplary embodiments the cache controller 204 gives the highest priority to all requests originating from the refresh requestor 234 and external refresh requestor 404. At block 604 the cache controller 204 determines if the addressable memory circuit 308 targeted by the refresh request is available. The addressable memory circuit 308 is available if no other resources are accessing those addressable memory circuits 308. At block 606, if the addressable memory circuits 308 are not available, the refresh request is placed in the front of a queue of all requests and waits until the addressable memory circuits 308 are available. At block 608, if the addressable memory circuits 308 are available, the access request is sent to the request interpreter 236 for processing. At block 610 the request interpreter 236 interprets the ID of the refresh request and determines if the refresh request is a request to access data (i.e. a data access request) in addressable memory circuits 308 of the eDRAM 304, or a request to refresh the addressable memory circuits 308, of the eDRAM 304. At block 612, if the request interpreter 236 determines that the refresh request is a request to refresh the addressable memory circuits 308 the request interpreter 236 causes the addressable memory circuits 308 targeted by the refresh request to be refreshed by rewriting the existing content of the memory circuits 308 in the target address range with the same contents that they currently contain. For example, all binary 1 bits are reset to 1 and all binary 0 bits are cleared. Otherwise, if the request interpreter 236 determines that the request is a data access request, the refresh request interpreter 236 places the request on the cache pipeline 306 and the request is processed normally.

Although aspects of the present invention have been described as operating on various hardware and circuit components, it will be understood that the invention may be realized by software or a combination of software and hardware components as will be understood.

Technical effects and benefits include transmitting requests to refresh memory contents as high priority data access requests over a cache pipeline. These refresh requests are sent at a rate sufficient to maintain the data integrity of the cache memory.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer system for implementing cache memory refreshes in a high performance cache comprising:
a cache comprising a memory refresh requestor, a memory request interpreter, a cache memory, a cache pipeline, and a cache controller on a single chip, the cache pipeline configured to receive a memory refresh request to refresh contents of a memory address range in the cache memory and a memory access request for the memory address range;
the cache controller configured to receive from a requestor the memory access request for the memory address range, the cache controller configured for:
storing the received pipeline mode in a mode register;
determining whether the cache memory located at the memory address range is available or unavailable;
when the cache memory located at the memory address range is available, sending the memory access request for the memory address range to the memory request interpreter;
when the cache memory located at the memory address range is unavailable:
deferring the memory access request for the memory address range;
modifying the pipeline mode in the mode register to indicate the memory access request for the memory address range; and
based on the pipeline mode being modified, attempting the memory access request by a subsequent request from the requestor;
the memory request interpreter configured for receiving the memory refresh request and the memory access request, and refreshing data in the memory address range based on receiving the memory refresh request, the memory request interpreter giving a higher priority to the memory refresh request than a priority given to the memory access request.

2. The computer system of claim 1, wherein the cache memory comprises embedded dynamic random access memory (eDRAM).

3. The computer system of claim 1, wherein the memory access request received by the cache controller further comprises:
an identification (ID), the ID indicating that the memory access request is not a refresh request; and
the memory address range.

4. The computer system of claim 1, wherein the cache memory degrades over a period of time, and the memory refresh requestor sends a plurality of memory refresh requests, the plurality of memory refresh requests sent at a refresh interval, the refresh interval comprising a number of processing cycles corresponding to a maximum number of processing cycles that can be processed over the period of time.

5. The computer system of claim 1, wherein the memory request interpreter receives memory access requests from a plurality of memory access request sources.

6. The computer system of claim 5 wherein, the memory request interpreter places the memory access request on the cache pipeline.

7. The computer system of claim 1, wherein the cache memory is a level four cache.

8. The computer system of claim 1, wherein the memory address range targeted by the memory refresh request is maintained within the cache pipeline, and the memory address range is incremented in the cache pipeline based on receiving the memory refresh request.

9. The computer system of claim 1, wherein the cache controller is further configured to receive an additional signal from the requestor, and wherein the pipeline mode is only modified by the cache controller based on the additional signal indicating that the cache controller is permitted to modify the pipeline mode.

10. The computer system of claim 1, wherein the requestor comprises a core of the computer system.

11. The computer system of claim 1, wherein the requestor comprises a cache of the computer system that is a lower-level cache than the cache that receives the memory access request from the requestor.

* * * * *